United States Patent
Ulriksson et al.

(10) Patent No.: US 7,555,070 B1
(45) Date of Patent: Jun. 30, 2009

(54) PARALLEL MAXIMUM A POSTERIORI DETECTORS THAT GENERATE SOFT DECISIONS FOR A SAMPLED DATA SEQUENCE

(75) Inventors: Bengt A. Ulriksson, Milford, MA (US); Rose Y. Shao, Worcester, MA (US)

(73) Assignee: Maxtor Corporation, Longmont, CO (US)

( * ) Notice: Subject to any disclaimer, the term of this patent is extended or adjusted under 35 U.S.C. 154(b) by 825 days.

(21) Appl. No.: 11/045,632

(22) Filed: Jan. 28, 2005

Related U.S. Application Data

(60) Provisional application No. 60/559,242, filed on Apr. 2, 2004, provisional application No. 60/568,750, filed on May 6, 2004.

(51) Int. Cl.
*H04L 27/06* (2006.01)
*H03M 13/00* (2006.01)

(52) U.S. Cl. ....................... 375/341; 714/795

(58) Field of Classification Search ............ 375/260, 375/262, 265, 340, 341; 714/769, 770, 794, 714/795; 360/46, 51
See application file for complete search history.

(56) References Cited

U.S. PATENT DOCUMENTS

| | | | |
|---|---|---|---|
| 5,917,863 A * | 6/1999 | Soichi et al. ............... | 375/341 |
| 5,933,462 A | 8/1999 | Viterbi et al. ............... | 375/341 |
| 6,185,716 B1 * | 2/2001 | Riggle ......................... | 714/769 |
| 6,993,704 B2 * | 1/2006 | Wolf ........................... | 714/794 |
| 2003/0066019 A1 * | 4/2003 | Hepler et al. ................ | 714/794 |
| 2005/0149836 A1 * | 7/2005 | Tanaka ........................ | 714/794 |

OTHER PUBLICATIONS

Boutillon et al; *VLSI Architectures for the MAP Algorith*, IEEE Transactions on Communications, vol. 51, No. 2; Feb. 2003, pp. 175-185.
Worm et al.; *VLSI Architectures for High-Speed MAP Decoders*, IEEE, 2003, pp. 446-453.

* cited by examiner

*Primary Examiner*—Young T. Tse
(74) *Attorney, Agent, or Firm*—Myers Bigel Sibley & Sajovec, P.A.

(57) ABSTRACT

A soft decision value output detector includes a plurality of maximum a posteriori (MAP) detectors. The MAP detectors are connected in parallel, and configured to simultaneously generate state metrics for portions of a sampled data sequence, and to generate soft decision values based on the generated state metrics. The MAP detectors may generate soft decision values in a fixed latency manner and without buffering the sampled data sequence for a whole sector of a disk in a disk drive. The MAP detectors may generate soft decision values for portions of the sampled data sequence at least at a rate at which the portions of the sampled data sequence are input to the MAP detectors.

22 Claims, 8 Drawing Sheets

PARALLEL MAXIMUM A POSTERIORI DETECTORS THAT GENERATE SOFT DECISIONS FOR A SAMPLED DATA SEQUENCE

RELATED APPLICATION

This application claims the benefit of and priority to U.S. Provisional Patent Application No. 60/568,750, filed May 6, 2004, and U.S. Provisional Patent Application No. 60/559,242, filed Apr. 2, 2004, the disclosures of which are hereby incorporated herein by reference as if set forth in their entirety.

FIELD OF THE INVENTION

The present invention generally relates to data storage devices and, more particularly, to detectors and methods for generating soft decision values from a sampled data sequence, such as from a read signal in a disk drive.

BACKGROUND OF THE INVENTION

Data storage systems, such as disk drives, need to be able to accurately detect data that has been stored on a storage media. For example, in a magnetic disk drive system, data is stored as a coded series (i.e., a binary series) of magnetic transitions recorded on the surface of a magnetic disk. The read signal, formed by reading the recorded transitions, is often distorted. Some distortion can be deterministic due to geometry of the head/media system, while other distortion can be variable due to proximity of other transitions, localized deformities in the media, and irregular grain structure of the media. In addition, noise may be added to the read signal from head (transducer) resistance, cable parasitics, and interference from other electronics. Collectively, noise and variable distortion tend to obscure the data within the read signal.

To compensate for the occurrence of errors in a read signal, most data storage systems use an encoder to apply error correction coding to the data before it is stored on a media. The read signal is sampled, and a decoder is used to attempt to detect and correct errors in the sampled signal.

A major source of impairments in magnetic recording channels is the limited bandwidth of the heads and the media compared with the data rate which produces inter symbol interference (ISI). The Viterbi detector is a known technique for removing ISI in an optimum manner. The complexity of the Viterbi detector increases exponentially with the length of the ISI, so the Viterbi detector is usually combined with a finite impulse response (FIR) filter. The FIR filter reduces the ISI length by shaping the channel pulse response to some short well-controlled partial response target. The length of the target k is called the constraint length of the (filtered) channel, and $m=k-1$ is the channel memory length, where k is usually less than 5 for manageable complexity of the detector.

An ISI channel with memory length m can be represented by a trellis diagram of $2^m$ states, each state corresponding to the delayed input bits. Referring to FIGS. 1 and 2, an exemplary trellis of the channel of target 1-D (FIG. 1) having two states, "state 0" and "state 1", is shown. Each state is reachable by two previous states given an input bit, and each state can lead to two different states given 0 or 1 as the input bit. A path in the trellis composed of N sections (or levels) can represent a data block of N bits and the corresponding noiseless readback sequence. A Viterbi algorithm uses the trellis diagram of an ISI channel to determine the most likely input sequence by computing the transition probability from each of the states to the next set of states, in view of what is observed or read-back in the presence of channel noise. The probabilities are represented by quantities called metrics. If metrics are defined to be proportional to the negative of the logarithm of the probability, adding of the metrics is equivalent to the reciprocal of the product of the probabilities. Thus, smaller metrics correspond to higher probability events.

Two types of metrics are state metrics, sometimes called path metrics, and branch metrics. A state metric represents the maximum probability that the set of read-back symbols leads to the state with which it is associated. A branch metric represents the conditional probability of the read-back symbol given that the transition from one state to another occurred.

There are two possible states leading to any given state, each corresponding to the occurrence of a zero or a one in the highest ordered memory unit of the channel (the right most register referring to FIG. 1). A detector decides which is the more likely state by an add-compare-select (ACS) operation. Add refers to adding each state metric at the preceding level to the two branch metrics of the branches for the allowable transitions. Compare refers to comparing the pair of such metric sums for paths entering a state (node) at the given level. Select refers to selecting the higher probable one of the two possible states and discarding the other. Thus, only the winning branch is preserved at each node, along with the node state metric. If the two quantities being compared are equal, either branch may be selected, because the probability of an erroneous selection will be the same in either case.

A practical Viterbi detector works on a window size of W, where $W >= C$ and C is the convergence length, which may be 4 to 5 times the memory length of the channel. After the first W trellis sections are processed, the detector compares the 2 state metrics at the window boundary and the most probable state is selected. A chain back operation is then performed from that state, and the hard decision on the input bit related to the leftmost section can be obtained. Afterwards, the processing window is shifted one section to the right, and the next input bit can be determined in the same manner. It shall be appreciated that each hard decision is made with a fixed lag of W sections for reliable output after sufficient convergence.

A soft detector not only outputs hard decisions, but also outputs soft decision values. The sign of each soft decision value can indicate the hard decision (i.e., logic zero or logic one), and the magnitude of the soft decision value can indicate the level of confidence in the hard decision. A soft detector and soft decoder combination utilizes the soft values to improve the system performance.

Soft detection can be computationally intensive and uses more memory than hard detection. For these and other reasons, soft detectors can be difficult to implement in high input/output data bandwidth data storage systems.

The maximum a posteriori (MAP) algorithm is one type of algorithm that generates soft decision values based on a memory system (e.g., an ISI channel, or a convolutional code). As used herein, 'MAP' includes its simplified versions, which include the logarithm domain or log-MAP, and min-sum type algorithms. The log-MAP and its simplified versions are not distinguished herein because they can include the same or similar major functional blocks. It is observed that: 1) the MAX function in max-log-MAP is more accurately replaced by MAX* function in log-MAP using a correction term which is usually implemented in a look-up-table; 2) the difference between the max-log-MAP and the min-sum algorithms lies in the choices of branch metrics, so that the most probable event has the largest path metric in the max-log-MAP algorithms and the smallest in the min-sum algorithm.

SUMMARY OF THE INVENTION

In some embodiments of the present invention, a soft decision value output detector includes a plurality of maximum a posteriori (MAP) detectors. The MAP detectors are configured to simultaneously generate state metrics for portions of a sampled data sequence, and to generate soft decision values based on the generated state metrics.

The MAP detectors may be max-log-MAP or min-sum detectors. Each of the MAP detectors can include a first MAP unit and a second MAP unit. The first MAP unit can include a first reverse Viterbi operator and a first forward Viterbi operator, and can be configured to generate state metrics by a reverse iteration and a forward iteration through portions of the sampled data sequence. The second MAP unit can include a second reverse Viterbi operator and a second forward Viterbi operator, and can be configured to generate state metrics by a reverse iteration and a forward iteration through portions of the sampled data sequence. The first forward Viterbi operator and the first reverse Viterbi operator can be configured to converge and output state metrics based on partially overlapped portions of the sampled data sequence. Similarly, the second forward Viterbi operator and the second reverse Viterbi operator can be configured to converge and output state metrics based on partially overlapped portions of the sampled data sequence.

The plurality of MAP detectors can include a number (P) of MAP detectors that is at least as large as a ratio of a rate at which the sampled data sequence is input to the MAP detectors and a rate at which the MAP detectors process the sampled data sequence. Accordingly, the MAP detectors may generate soft decision values in a fixed latency manner and without buffering the sampled data sequence for a whole sector of a disk in a disk drive. The MAP detectors may generate soft decision values for portions of the sampled data sequence at least at a rate at which the portions of the sampled data sequence are input to the MAP detectors.

In another embodiment of the present invention, each of the MAP detectors can include a first reverse Viterbi operator, a second reverse Viterbi operator, and a forward Viterbi operator. The plurality of MAP detectors may then include a number of MAP detectors that is at least one plus the ratio of a rate at which the sampled data sequence is input to the MAP detectors and a rate at which each MAP detector processes the sampled data sequence. The MAP detectors may then generate soft decision values for portions of the sampled data sequence at least at a rate at which the portions of the sampled data sequence are input to the MAP detectors.

The Viterbi operators are configured to generate state metrics from a trellis diagram of portions of the sampled data sequence in a same fashion as a conventional Viterbi detector. However, they differ from a conventional Viterbi detector, in that: 1) they may not contain surviving path memory, and they may not provide chain back operations for hard decisions; 2) their associated ACS algorithm may include table look-up operations for MAX* justification; and 3) they may process portions of the data sequence in forward or reverse order, starting with arbitrary state metrics indicating no known initial state.

The MAP detectors are configured to simultaneously generate state metrics for partially overlapped multiple convergence length portions of the sampled data sequence. Each of the MAP detectors can be configured to generate soft decision values for a portion of the sampled data sequence that is adjacent to a portion of the sampled data sequence for which another one of the MAP detectors generates soft decision values. Within each of the MAP detectors, the first MAP unit can be configured to generate soft decision values for a first portion of the sampled data sequence that is nonadjacent to a second portion of the sampled data sequence for which the second MAP unit generates soft decision values, and can generate soft decision values about one convergence length sample time before the second MAP unit generates soft decision values.

The MAP detectors can be configured to generate soft decision values for sequential portions of the sampled data sequence. The plurality of MAP detectors can include, for example, four MAP detectors. The first MAP detector can be configured to generate soft decision values for a first portion of the sampled data sequence. The second MAP detector can be configured to generate soft decision values for a second portion of the sampled data sequence that is immediately adjacent to the first portion. The third MAP detector can be configured to generate soft decision values for a third portion of the sampled data sequence that is immediately adjacent to the second portion. The fourth MAP detector can be configured to generate soft decision values for a fourth portion of the sampled data sequence that is immediately adjacent to the third portion.

The MAP detectors can be configured to generate soft decision values about one convergence length sample time after another one of the MAP detectors generates soft decision values. Accordingly, the soft decision values generated by the MAP detectors can have less than a convergence length sample time therebetween. The sampled data sequence can be based on a read signal of data recorded on a disk in a disk drive.

In some other embodiments of the present invention, a disk drive includes a disk, a transducer, an analog-to-digital converter, and a plurality of MAP detectors. The disk is configured to store data. The transducer is configured to read data from the disk to generate a read signal. The analog-to-digital converter is configured to generate a sampled data sequence from the read signal. The MAP detectors are configured to simultaneously generate state metrics for portions of the sampled data sequence, and to generate soft decision values based on the generated state metrics.

In some other embodiments of the present invention, a method of generating soft decision values based on a sampled data sequence includes generating state metrics for partially overlapped portions of the sampled data sequence at a same time using a plurality of MAP detectors, and generating soft decision values based on the generated state metrics.

The state metrics can be generated based on a plurality of partially overlapped convergence length portions of the sampled data sequence at a same time. Each of the MAP detectors can include a first MAP unit and a second MAP unit, and the first and second MAP units can be operated at a same time to generate state metrics therein for partially overlapping portions of the sampled data sequence.

The first MAP unit can include a first reverse Viterbi operator and a first forward Viterbi operator, and the second MAP unit can include a second reverse Viterbi operator and a second forward Viterbi operator. The first and second MAP units can be operated at a same time. In particular, the reverse and the forward Viterbi operators of the first MAP unit can be operated at a same time to reverse iterate and forward iterate through a portion of the sampled data sequence to generate Viterbi based state metrics through a learning mode and a converged mode, and the reverse and the forward Viterbi operators of the second MAP unit can be operated at a same time to reverse iterate and forward iterate through portions of the sampled data sequence to generate Viterbi based state metrics through a learning mode and a converged mode.

Alternatively, each of the MAP detectors can include a first reverse Viterbi operator, a second reverse Viterbi operator and a forward Viterbi operator. The first and second reverse Viterbi operators can be operated at a same time to reverse iterate through portions of the sampled data sequence to generate Viterbi based state metrics, and the forward Viterbi operator can be operated to forward iterate through portions of the sampled data sequence to generate Viterbi based state metrics.

DETAILED DESCRIPTION OF THE INVENTION

Figure 1:
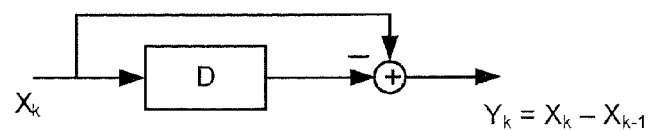
FIG. 1 is a block diagram that represents a conventional ISI channel 1-D, with a memory order of one.

The present invention now will be described more fully hereinafter with reference to the accompanying drawings, in which embodiments of the invention are shown. However, this invention should not be construed as limited to the embodiments set forth herein. Rather, these embodiments are provided so that this disclosure will be thorough and complete, and will fully convey the scope of the invention to those skilled in the art. Like numbers refer to like elements throughout.

It also will be understood that, as used herein, the term "comprising" or "comprises" is open-ended, and includes one or more stated elements, steps and/or functions without precluding one or more unstated elements, steps and/or functions. As used herein the term "and/or" includes any and all combinations of one or more of the associated listed items.

The present invention may be embodied as apparatus, methods, and/or computer program products. Accordingly, the present invention may be embodied in hardware and/or in software (including firmware, resident software, micro-code, etc.). Furthermore, the present invention may take the form of a computer program product on a computer-usable or computer-readable storage medium having computer-usable or computer-readable program code embodied in the medium for use by or in connection with an instruction execution system. In the context of this document, a computer-usable or computer-readable medium may be any medium that can contain, store, communicate, propagate, or transport the program for use by or in connection with the instruction execution system, apparatus, or device.

The computer-usable or computer-readable medium may be, for example but not limited to, an electronic, magnetic, optical, electromagnetic, infrared, or semiconductor system, apparatus, device, or propagation medium. More specific examples (a nonexhaustive list) of the computer-readable medium would include the following: an electrical connection having one or more wires, a portable computer diskette, a random access memory (RAM), a read-only memory (ROM), an erasable programmable read-only memory (EPROM or Flash memory), an optical fiber, and a portable compact disc read-only memory (CD-ROM). Note that the computer-usable or computer-readable medium could even be paper or another suitable medium upon which the program is printed, as the program can be electronically captured, via, for instance, optical scanning of the paper or other medium, then compiled, interpreted, or otherwise processed in a suitable manner, if necessary, and then stored in a computer memory.

Various embodiments of the present invention are described below with reference to block diagrams and/or operational illustrations of apparatus, methods, and computer program products. It is to be understood that the functions/acts noted in the blocks may occur out of the order noted in the operational illustrations. For example, two blocks shown in succession may in fact be executed substantially concurrently or the blocks may sometimes be executed in the reverse order, depending upon the functionality/acts involved.

Although embodiments of the present invention are described herein in the context of disk drives for purposes of illustration, the present invention is not limited thereto. For example, the detectors and methods described herein may be used in, for example, communication systems, which can include wireless communication systems. The detector may be modified, while maintaining the parallel structure of embodiments of the present invention, to soft decode convolutional codes.

Figure 3:
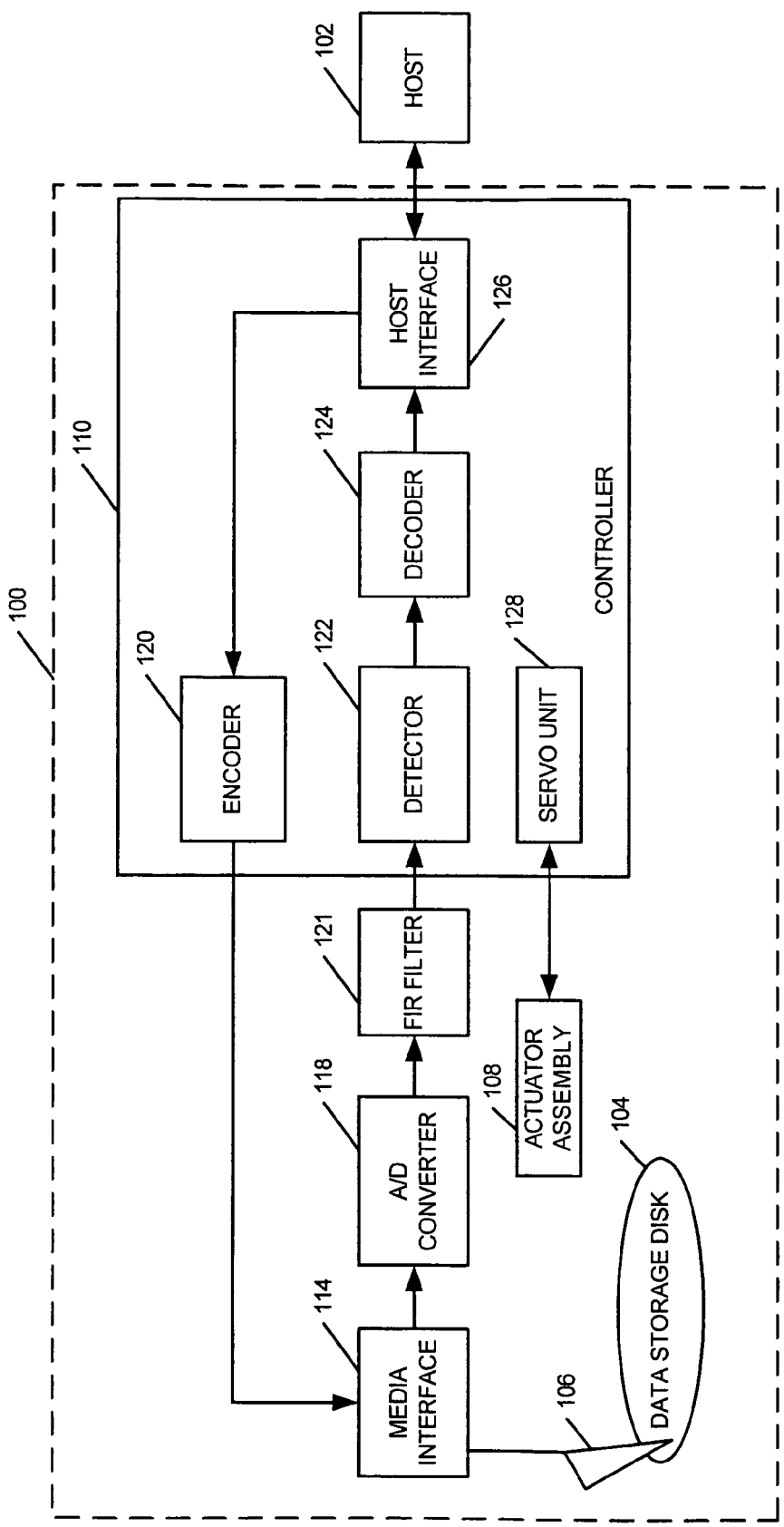
FIG. 3 is a block diagram of representative components of a disk drive in which a detector generates soft decision values in accordance with some embodiments of the present invention.

FIG. 3 illustrates representative components of a disk drive 100 in which detection according to some embodiments of the present invention may be implemented. The disk drive 100 is configured to perform data storage and retrieval functions for an external host computer 102. The disk drive 100 includes: a data storage disk 104, a transducer 106, an actuator assembly 108, a controller 110, a disk media interface 114, and an analog-to-digital converter 118. The disk 104 may be a magnetic disk, optical disk, or any other type of storage disk, and which may have data storage tracks defined on one or both of its storage surfaces. The disk 104 is rotated while data is read from and written to the tracks. Although only one disk 104 is shown, as is well known in the art, the disk drive 100 may include a plurality of disks mounted to a common spindle, and with each disk accessed by one or more separate transducers.

Transducer 106 may be a magneto-resistive head (MR), or similar device, that is configured to read and write data from the data storage disk 104. The transducer 106 is associated in a "flying" relationship adjacent to a storage surface of the disk 104, where it may be radially positioned by the actuator assembly 108 in order to read and/or write data on a storage surface of the disk 104. The media interface 114 can include amplifiers and other components for conditioning signals that are read from, and written through, the transducer 106 on the disk 104.

The controller 110 can include: an encoder 120, a detector 122, a decoder 124, a host interface 126, and a servo unit 128. The host interface 126 is configured to communicate data between the disk drive 100 and the host 102. The detector can be treated as part of the read-channel in a conventional manner, or as part of the controller 110 as shown in FIG. 3. Although only a single controller 110 is shown in FIG. 3, it is to be understood that the functions thereof may centralized in a single circuit element, or they may be distributed among more than one circuit element, such as among parallel connected digital signal processors (DSPs) and associated software, parallel connected general purpose processors and associated software, parallel connected application-specific integrated circuits (ASICs), logic gates, analog components and/or a combination thereof.

During a write operation, data from the host 102 is encoded by the encoder 120, which may be a convolutional or a block encoder, to form an output data sequence. The output data sequence is conditioned by the media interface 114 and written on the disk 104 via the transducer 106.

During a read operation, a read signal is formed by the transducer 106 and conditioned by the media interface 114, and is converted to a sampled data sequence by the A/D converter 118. The A/D converted samples are further filtered through FIR filter 121 to match the ISI target of length k=m+1, where m is the memory order of the filtered ISI channel. The detector 122 is configured to form soft decision values based on the sampled data sequence using a plurality of parallel connected maximum-a-posteriori (MAP) detectors, such as parallel max-log-MAP detectors, as will be further discussed below. The soft decision values are utilized by the decoder 124 for decoding. The decoder 124 may be, for example, a soft Reed-Solomon decoder or an iterative decoder which may include low density parity check (LDPC) codes or convolutional codes. The decoded data can then be communicated by the host interface 126 to the host 102.

Figure 4:
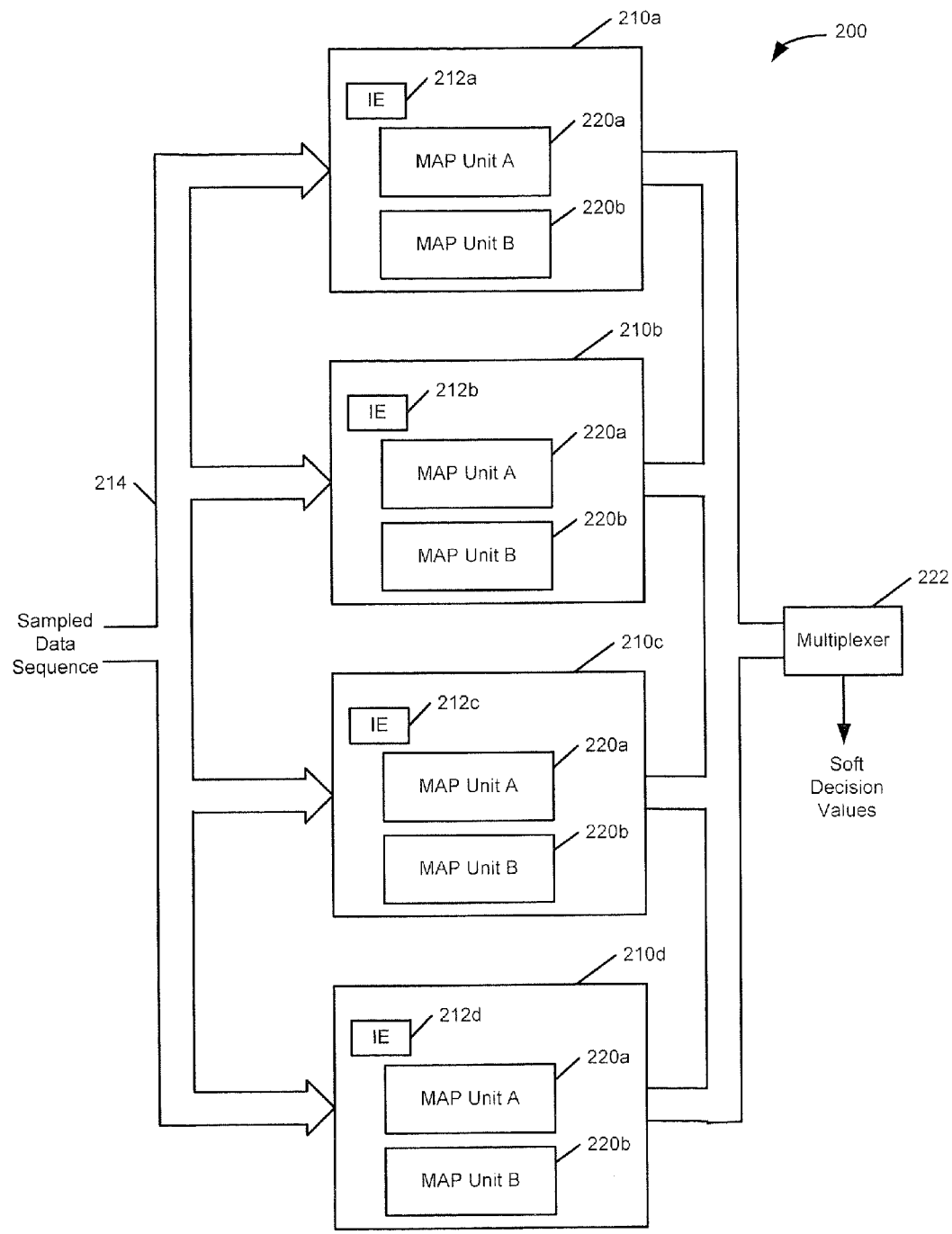
FIG. 4 is a block diagram of a parallel detector that includes a plurality (four as shown) of MAP detectors, each with a pair of MAP units, that generate soft decision values in accordance with some embodiments of the present invention.

Referring now to FIG. 4, a block diagram is shown of an exemplary parallel detector 200 that generates soft decision values based on a sampled data sequence according to some embodiments of the present invention. The detector 200 may be suitable for use as the detector 122 shown in FIG. 3. Each of the soft decision values can include an indication of each encoded data bit and a corresponding level of confidence in the indication. The detector 200 includes a plurality (4 as shown) of parallel connected MAP detectors 210a-d that are configured to simultaneously process portions of a sampled data sequence to generate soft decision based thereon. For example, during each process cycle (e.g., clock cycle) of the detector 200, the detector 200 may process P sampled data and generate P soft decisions based thereon. The P soft decisions may be generated with a constant latency between input of the sampled data sequence to the detector 200 and the output of the soft decision values.

As used herein, the terms "simultaneous" and "at the same time" when used to describe generation of state metrics for the sampled data sequence, refer to the parallel processing of portions of the data sequence during at least one instant in time, and do not mean the processing must begin or end at the same time. Instead, as will be further explained with reference to FIG. 5, an exemplary embodiment of the MAP detectors begin generating state metrics for partially overlapped portions of the data sequence in a staggered sequence as sufficient length portions of the data sequence are input to the parallel detector 200, and during at least one instant in time the MAP detectors 210a-d are each generating soft decision values for adjacent portions of the input data sequence.

Figure 5:
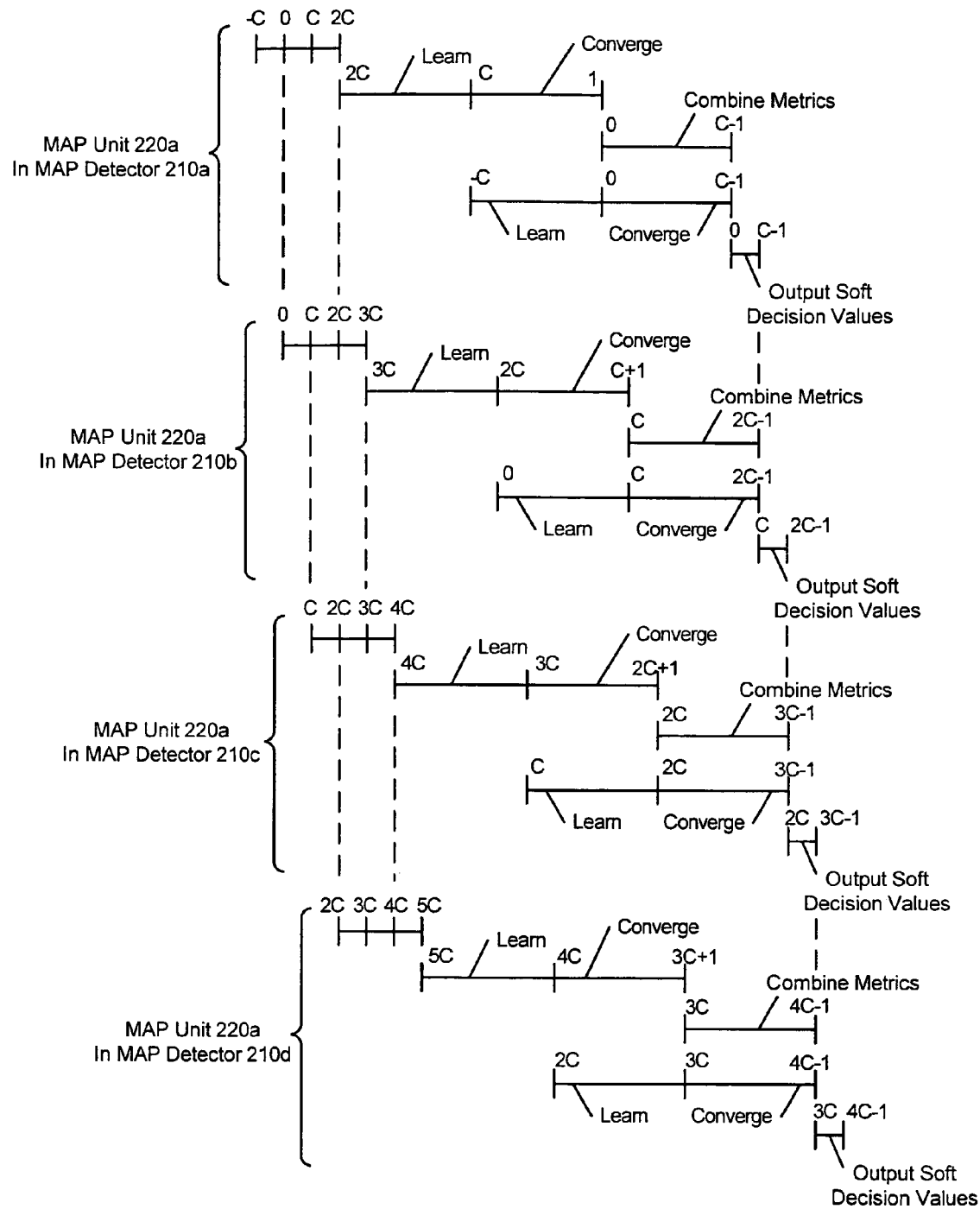
FIG. 5 is a timing diagram that illustrates parallel processing of consecutive portions of a sampled data sequence by four MAP units, or two MAP detectors, in accordance with some embodiments of the present invention.
Figure 6A:
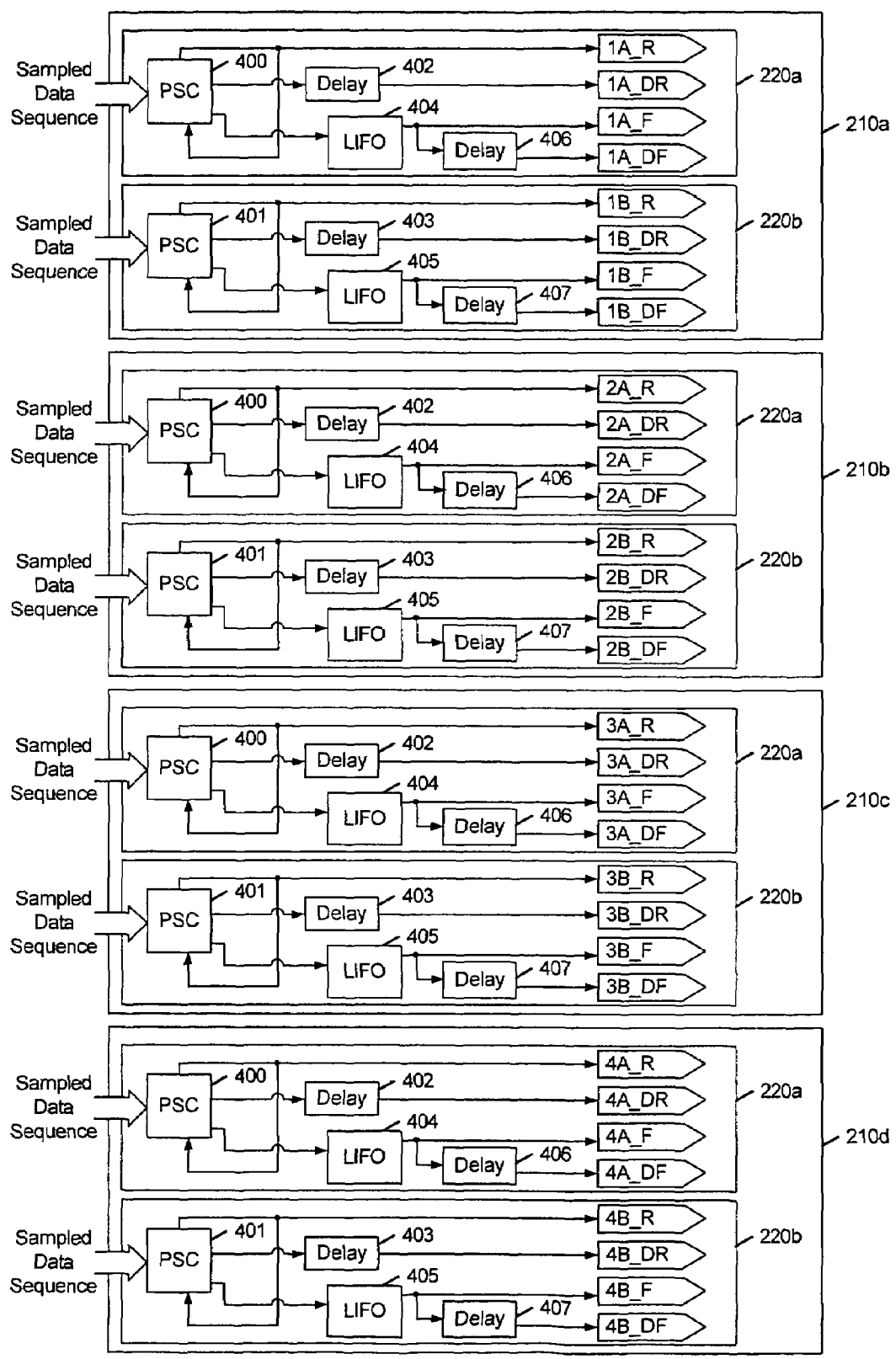
FIGS. 6*a-b* are a more detailed block diagram of the parallel MAP detectors of FIG. 4, in accordance with some embodiments of the present invention.

Different forms of serial MAP detectors and associated algorithms used therein are described in U.S. Pat. No. 5,933,462 and in "VLSI Architectures for the MAP Algorithm", IEEE Transactions on Communications, Vol. 51, No. 2, February 2003, the disclosures of which are hereby incorporated herein by reference as if set forth in their entirety. The publication paper above describes a MAP algorithm that contains two MAP units, each of which includes a forward Viterbi operator and a reverse Viterbi operator. Some embodiments of the present invention related to FIGS. 4-6 are based on these algorithms. U.S. Pat. No. 5,933,462 describes a MAP detector with one forward Viterbi operator and two reverse Viterbi operators. Some embodiments of the present invention related to FIG. 7 are based on this algorithm.

The number (P) of MAP detectors 210a-d, called parallelism, may be selected based on (e.g., a ratio of) the rate at which the sampled data sequence is input to the detector 200 and the rate at which each of the MAP detectors 210a-d in the detector 200 can process the sampled data sequence (e.g., cycle frequency of each MAP detector in the detector 200) to generate soft decision values. For example, the number of MAP detectors (P) may be at least as large as the ratio of the input rate and the process rate of each MAP detector. Four MAP detectors 210a-d are shown in FIG. 4, which can operate at a sufficient processing rate so that the sampled data sequence is processed at the rate at which it is input to the detector 200.

By selecting the number of parallel connected detectors so that the sampled data sequence is processed at the rate at which it is input to the detector 200, the detector 200 may avoid the need for a relatively large buffer for data that is read from a whole sector of a disk in a disk drive, and which may otherwise be needed by the detector 200 for soft detection. For example, the sampled data sequence that is input to the detector 200 may be buffered to provide a delay of a fixed number of cycles from input to output of the detector 200. Such a buffer is significantly smaller than a buffer for sampled data from a whole sector.

The sampled data sequence is sequentially fed to different ones of the MAP detectors 210a-d via, for example, a parallel bus 214. The MAP detectors 210a-d may be separately loaded with sequential portions of the sampled data sequence by sequentially enabling input enable (IE) logic 212a-d associated with respective ones of the detectors 210a-d.

Each of the MAP detectors 210a-d includes two MAP units, MAP unit A 220a and MAP unit B 220b. Each MAP unit operates over three consecutive convergence length portions of the sampled data sequence. Each MAP unit contains one forward Viterbi operator which processes the data sequence in the receive order, and one reverse Viterbi operator which processes the data sequence in a reversely received order.

MAP unit A 220a and MAP unit B 220b can start from an arbitrary set of state metrics, and begin learning over opposite outer portions of the three consecutive portions of the sampled data sequence (one backward learning and one forward learning). In this manner the MAP units A and B 220a-b can develop reliable state metrics before generating soft decisions, by combining their converged state metrics in the center portion, between the previously learning outer portions of the three consecutive convergence length portions of the sampled data sequence. The soft decision values from each of the MAP detectors 210a-d can be multiplexed by a multiplexer 222 to form a sequence of soft decision values that corresponds to the sampled data sequence. An exemplary timing diagram and associated method of the simultaneous generation of state metrics for the sampled data sequence is now described with reference to FIG. 5.

Referring now to FIG. 5, a timing diagram illustrates simultaneous generation of state metrics by the two detectors 210a-b, shown in FIG. 4, for consecutive portions of the sampled data sequence, in accordance with some embodiments of the present invention. The Viterbi operators in each MAP unit have convergence length C, which can be based on the target length used by the FIR filter 121 to equalize the sampled data sequence (FIG. 3). The first MAP unit 220a in MAP detector 210a receives three consecutive portions from −C to 2C of the sampled data sequence. Within the first MAP unit 220a in MAP detector 210a, a reverse Viterbi operator A 408 (FIG. 6b) begins 'learning' its state metrics based on the sequence from 2C to C (i.e., backward learning), and then produces reliable state metrics based on the sequence from C to 1. The metric reversal stack 412 (FIG. 6b) receives the state metrics in the sequence C−1 to 0 and reverses the sequence to 0 to C−1. After the reverse Viterbi operator A 408 has completed the learning phase, a forward Viterbi operator A 420 (FIG. 6b), in MAP unit 220a of MAP detector 210a, begins learning based on the sequence from −C to 0 (i.e., forward learning), and then produces reliable state metrics based on the sequence from 0 to C−1. As the forward Viterbi operator A 420 is generating the reliable state metrics sequence from 0 to C−1, these state metrics are combined with the state metrics from the metric reversal stack so that, soft decision values are output for sequence 0 to C−1.

Figure 6B:
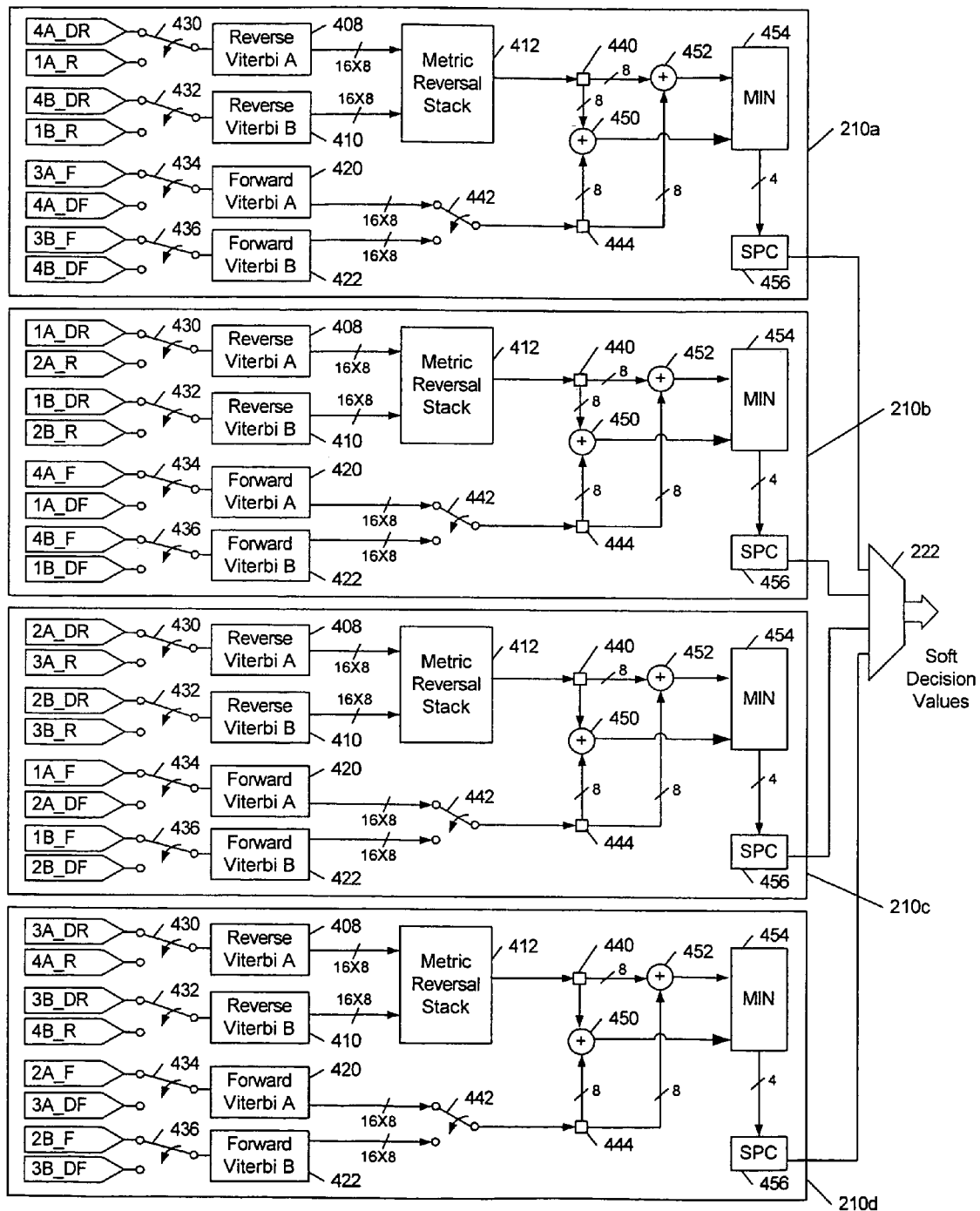
Figure 7:
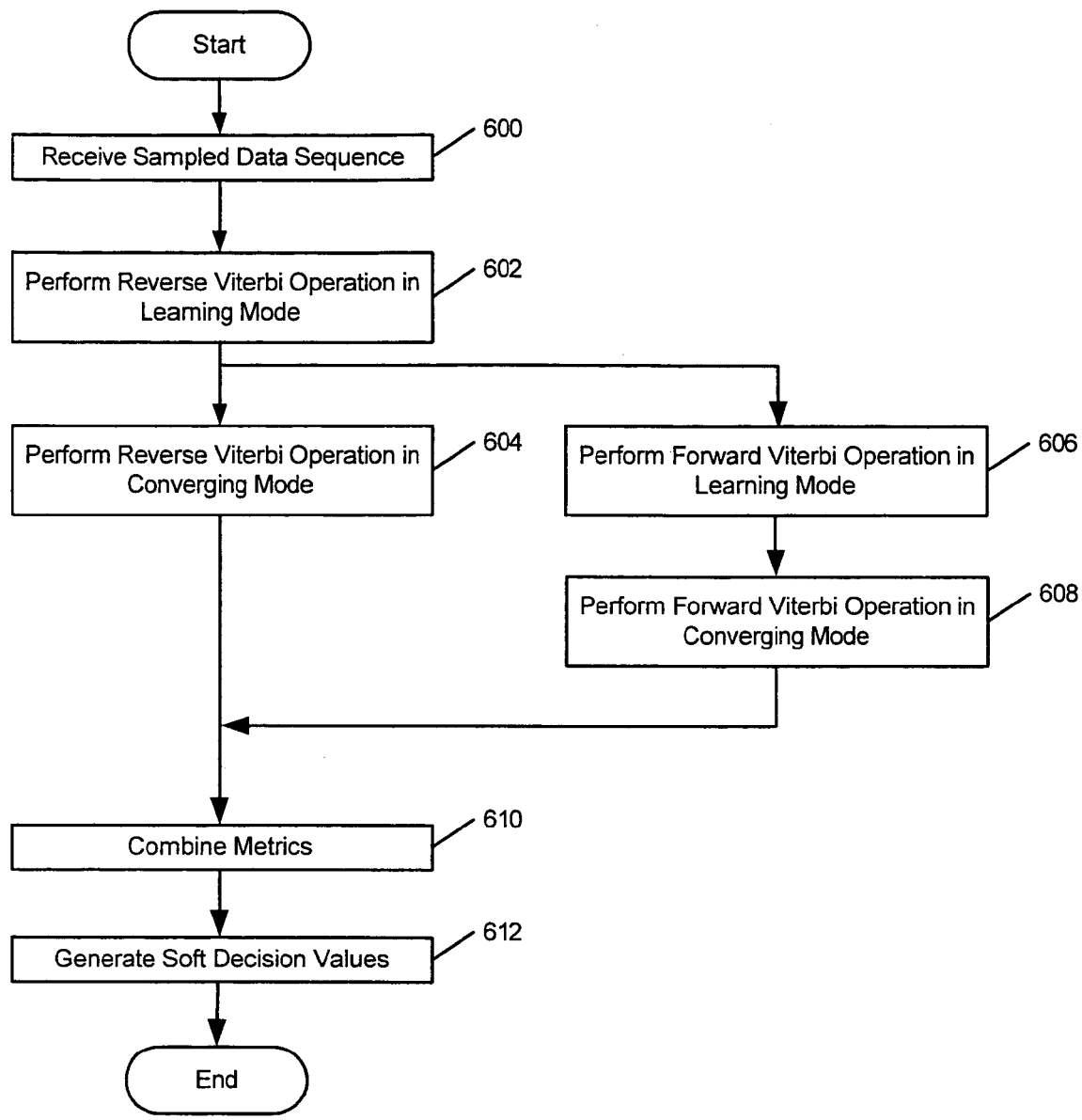
FIG. 7 is a flowchart of operations for generating soft decision values for a portion of C data samples with a MAP unit in accordance with some embodiments of the present invention.

It is further noted that an offset of one sample time is provided between the sampled data sequence processed by the reverse Viterbi operators 408 & 410 (FIG. 6b) and forward Viterbi operators 420 & 422 (FIG. 6b). This offset may allow the use of sample cycles to control transition between metric states. For example, the metrics are combined at a particular state (i), such that sample cycle (i) may be used to transition forward detector 420 from state (i−1) to (i), and sample cycle (i+1) may be used to transition reverse detector 408 from state (i+1) to (i).

In parallel with the generation of state metrics by the first MAP unit 220a in MAP detector 210a, the first MAP unit 220a in MAP detector 210b receives three consecutive portions from 0 to 3C of the sampled data sequence. Within the first MAP unit 220a in MAP detector 210b, the reverse Viterbi operator A 408 (FIG. 6b) begins learning its state metrics based on the sequence from 3C to 2C (i.e., backward learning), and then produces reliable state metrics based on the sequence from 2C to C+1. The metric reversal stack 412 receives the state metrics in the sequence 2C−1 to C and reverses the sequence to C to 2C−1. After the reverse Viterbi operator A 408 has completed the learning phase, a forward Viterbi operator A 420 (FIG. 6b), in MAP unit 220a of MAP detector 210b, begins learning based on the sequence from 0 to C (i.e., forward learning), and then produces reliable state metrics based on the sequence from C to 2C−1. As the forward Viterbi operator A 420 is generating the reliable state metrics from C to 2C−1, these state metrics are combined with the state metrics from the metric reversal stack 412 so that, soft decision values are output for sequence C to 2C−1. Accordingly, the first MAP units 220a in MAP detectors 210a and 210b simultaneously generate state metrics based on partially overlapped portions of the sampled data sequence.

In parallel with the generation of state metrics by the first MAP unit 220a in MAP detector 210b, the first MAP unit 220a in the third MAP detector 210c receives three consecutive portions from C to 4C of the sampled data sequence. Within the first MAP unit 220a in the third detector 210c, a reverse Viterbi operator A 408 (FIG. 6b) begins learning its state metrics based on the sequence from 4C to 3C (i.e., backward learning), and then produces reliable state metrics based on the sequence from 3C to 2C+1. The metric reversal stack 412 receives the state metrics in the sequence 3C−1 to 2C and reverses the sequence to 2C to 3C−1. After the reverse Viterbi operator 408 has completed the learning phase, a forward Viterbi operator A 420 (FIG. 6b), in MAP unit 220a of MAP detector 210c, converges on the sequence from C to 2C (i.e., forward learning), and then produces reliable state metrics based on the sequence from 2C to 3C−1. As the forward Viterbi operator A 420 is generating the sequence from 2C to 3C−1, these state metrics are combined with the state metrics from the metric reversal stack 412 so that soft decision values are output for sequence 2C to 3C−1.

In parallel with the generation of state metrics by the first MAP unit 220a in MAP detector 210c, the first MAP unit 220a in detector 210d receives three consecutive portions from 2C to 5C of the sampled data sequence. Within the first MAP unit 220a in MAP detector 210d, a reverse Viterbi operator A 408 (FIG. 6b) begins converging its state metrics based on the sequence from 5C to 4C (i.e., backward learning), and then produces reliable state metrics based on the sequence from 4C to 3C+1. The metric reversal stack 412 receives the state metrics in the sequence 4C−1 to 3C and reverses the sequence to 3C to 4C−1. After the reverse Viterbi operator A 408 has completed the learning phase, a forward Viterbi operator A 420 (FIG. 6b), in MAP unit 220a of MAP detector 210d, converges on the sequence from 2C to 3C−1 (i.e., forward learning), and then produces reliable state metrics based on the sequence from 3C to 4C−1. As the forward Viterbi operator A 420 is generating the sequence from 3C to 4C−1, these state metrics are combined with the state metrics from the metric reversal stack 412 so that soft decision values are output for sequence 3C to 4C−1.

Accordingly, as shown in FIG. 5, the MAP units 220a in all of the MAP detectors 210a to 210d simultaneously generate state metrics based on partially overlapped portions of the sampled data sequence. Moreover, soft decision values are continuously output with each cycle of the parallel detector 200. While the detector is generating soft output values based on metrics from MAP units 220a in detectors 210a to 210d, the MAP units 220b in detectors 210a to 210d are learning based on the sample sequences 3C to 9C. When the detector has finished producing data from the MAP units 220a, the MAP units 220b in detectors 210a to 210d are trained and will start producing reliable metrics for the sequences 4C to 5C−1, 5C to 6C−1, 6C to 7C−1 and 7C to 8C−1, respectively. The detector 200 can process the sampled data sequence at the rate at which it is input to the detector 200, and, consequently, it may process the input sampled data sequence with a buffer that is substantially smaller than what would otherwise be needed for processing by a single MAP unit or MAP unit pair. The soft decision values may thereby be generated with a constant latency between when a portion of the sampled data sequence to the detector 200 and when the corresponding soft decision values are generated therefrom.

Reference is now made to FIGS. 6a-b, which together form a more detailed block diagram of the parallel detector 200 shown in FIG. 4, in accordance with some embodiments of the present invention. The sampled data sequence is sequentially input to different ones of the MAP detectors 210a-d as follows: first sampled data in the sequence is input to forward Viterbi operator A 420 and reverse Viterbi operator A 408 within MAP detector 210a; second sampled data in the sequence is input to forward Viterbi operator A 420 and reverse Viterbi operator A 408 within MAP detector 210b;

third sampled data in the sequence is input to forward Viterbi operator A 420 and reverse Viterbi operator A 408 within MAP detector 210*c*; fourth sampled data in the sequence is input to forward Viterbi operator A 420 and reverse Viterbi operator A 408 within MAP detector 210*d*; fifth sampled data in the sequence is input to forward Viterbi operator B 422 and reverse Viterbi operator B 410 within MAP detector 210*a*; sixth sampled data in the sequence is input to forward Viterbi operator B 422 and reverse Viterbi operator B 410 within MAP detector 210*b*; seventh sampled data in the sequence is input to forward Viterbi operator B 422 and reverse Viterbi operator B 410 within MAP detector 210*c*; and eighth sampled data in the sequence is input to forward Viterbi operator B 422 and reverse Viterbi operator B 410 within MAP detector 210*d*.

Each of the first MAP units 220*a* in MAP detectors 210*a-d* includes a first parallel-to-serial converter (PSC) 400, a first delay device 402, a first last-in-first-out (LIFO) stack 404, a second delay device 406, a reverse Viterbi operator A 408, a forward Viterbi operator A 420, and a metric reversal stack 412. The PSC 400 converts, for example, 16 parallel data samples into a serial data sequence, and outputs on line 1A_R (for reverse Viterbi operator A 408 within MAP detector 210*a*) the serial data sequence in a reverse order from the input sequence. The reverse order serial data sequence is delayed by the first delay device 402 to generate a delayed reverse ordered sequence on line 1A_DR (for reverse Viterbi operator A 408 within MAP detector 210*b*). The reverse order serial data sequence is reversed by the LIFO stack 404 to generate a forward ordered serial data sequence on line 1A_F (for forward Viterbi operator A 420 within MAP detector 210*c*). The forward ordered serial data sequence is delayed by the second delay device 406 to generate a delayed forward ordered sequence on line 1A_DF (for forward Viterbi operator A 420 within MAP detector 210*b*).

Each of the second MAP units in detectors 210*a-d* includes the second parallel-to-serial converter (PSC) 401, the third delay device 403, the second last-in-first-out (LIFO) stack 405, and the fourth delay device 407, each of which operates as describe above for the MAP unit A in MAP detectors 210*a-d*. The second MAP units in MAP detectors 210*a-d* further include a reverse Viterbi operator B 410 and a forward Viterbi operator B 422.

As shown in FIGS. 6*a-b*, the serial data sequences on lines 1A_R, 1A_DR, 1A_F, 1A_DF, 1B_R, 1B_DR, 1B_F, and 1B_DF originate within MAP detector 210*a*; lines 2A_R, 2A_DR, 2A_F, 2A_DF, 2B_R, 2B_DR, 2B_F, and 2B_DF originate within MAP detector 210*b*; lines 3A_R, 3A_DR, 3A_F, 3A_DF, 3B_R, 3B_DR, 3B_F, and 3B_DF originate within MAP detector 210*c*; lines 4A_R, 4A_DR, 4A_F, 4A_DF, 4B_R, 4B_DR, 4B_F, and 4B_DF originate within MAP detector 210*d*.

The operation of MAP detector 210*a* is further described below, while further discussion of detectors 210*b-d* is omitted for brevity. It is to be understood that MAP detectors 210*b-d* operate in the same manner as described for MAP detector 210*a*, but with different serial data sequences as shown in FIGS. 5 and 6*a-b*, and as described herein.

In MAP detector 210*a*, reverse Viterbi operator A 408 alternates, as indicated by switch 430, between processing the reverse ordered serial data on lines 1A_R and 4A_DR. Reverse Viterbi operator B 410 alternates, as indicated by switch 432, between processing the reverse ordered serial data on lines 1B_R and 4B_DR. The reverse Viterbi operators A and B, 408 and 410, output their metric values to the metric reversal stack 412, which reverses the order of the metric values back to a forward sequence that corresponds to the input sampled data sequence. The metric values output by the metric reversal stack 412 are split into two groups of, for example 8 metric values, as indicated by splitter 440.

In MAP detector 210*a*, forward Viterbi operator A 420 alternates, as indicated by switch 434, between processing the forward ordered serial data on lines 3A_F and 4A_DF. Forward Viterbi operator B 422 alternates, as indicated by switch 436, between processing the forward ordered serial data on lines 3B_F and 4B_DF. The metric values from the forward Viterbi operators A and B, 420 and 422, are alternatively collected, as indicated by switch 442, and divided into two groups of, for example 8 metric values, by a splitter 444. One group of the metric values from the forward Viterbi operators A and B, 420 and 422, is combined at summing node 450 with a group of the metric values from the metric reversal stack 412, and input to, for example a minimum (MIN) metric detector for the min-sum algorithm, 454. The other group of the metric values from the forward Viterbi operators A and B, 420 and 422, is combined at summing node 452 with the other group of the metric values from the metric reversal stack 412, and input to the minimum metric detector 454. The minimum metric detector 454 identifies the minimum metric values in both groups of inputted metric values, and generates a soft decision value based on a difference between the identified minimum metric values. The soft decision value is output to a serial to parallel converter (SPC) 456, which outputs parallel soft decision values.

The soft decision values from the serial to parallel converter 456 of each of the MAP detectors 210*a-d* are provided to the multiplexer 222, which outputs a sequence of soft decision values that corresponds to the input sampled data sequence.

FIG. 7 is a flowchart of operations that may be carried out at least partially concurrently within each of a plurality of pairs of MAP units to simultaneously generate state metrics based on adjacent portions of a sampled data sequence, and to generate soft decision values therefrom, in accordance with some embodiments of the present invention. At Block 600, the sampled data sequence is received by one of the 8 MAP units. At Block 602, a reverse Viterbi based operation is performed to learn (train) metric values on a reverse sequence of the sampled data. At Block 604, a reverse Viterbi based operation is performed to converge the metric values on the reverse sequence of the sampled data. At Block 606, which is performed at least partially concurrent with performing Block 604, a forward Viterbi based operation is performed to learn (train) metric values on the forward sequence of the sampled data. At Block 608, a forward Viterbi based operation is performed to converge the metric values on the forward sequence of the sampled data. At Block 610, the metric values from the reverse and forward Viterbi based operations are combined. At Block 612, the soft decision values are generated based on the combined metric values.

Figure 8:
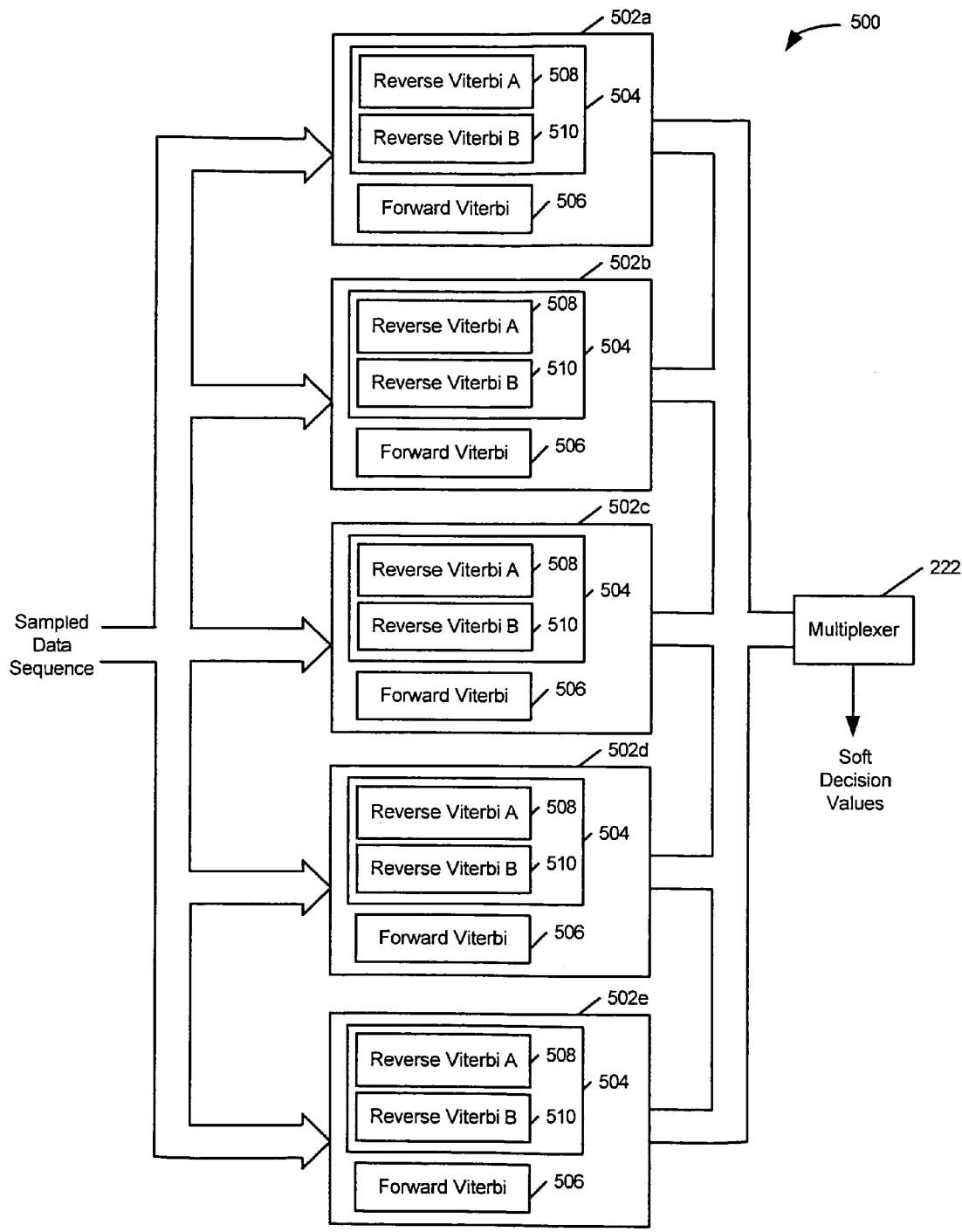
FIG. 8 is a block diagram of a parallel detector that generates soft decision values in accordance with some other embodiments of the present invention.

Referring now to FIG. 8, a parallel detector 500 is shown that includes five detectors 502*a-e* connected in parallel. The detector 500 can function similar to the detector 200 shown in FIG. 4. Each of the five detectors 502*a-e* includes a reverse Viterbi operator A 508, a reverse Viterbi operator B 510 and a forward Viterbi operator 506. The parallel detector 500 may operate substantially the same as was explained above for the parallel MAP detector 200, and as shown in FIGS. 4-6*a-b*. The single forward Viterbi operator 506 can learn over a convergence length portion of the sampled data sequence that immediately precedes the portion of the sampled data sequence on which forward Viterbi operator 506 produces reliable state metric values.

The two reverse Viterbi operators 508,510 in detectors 502a-e essentially work in the same way as the two reverse Viterbi operators 408,410 in MAP detectors 210a-d. They all alternate between the learning mode and the converged mode. One of the reverse Viterbi operators 508,510 produces reliable state metrics for one convergence length of sampled data; the other one produces reliable state metrics for an adjacent convergence length of sampled data. Like the forward Viterbi operators 420,422 in detectors 210a-d, but instead operating in a serial fashion, the one forward Viterbi operator 506 in each MAP detector 502a-e starts its processing from arbitrarily assigned state metrics corresponding to a mid point in the data sequence. After a processing period of learning mode, it continuously generates reliable state metrics. The reliable state metrics from the forward Viterbi operator 506 is combined with those from the reverse Viterbi operator 508 or 510 alternatively, after metric reversal, to produce soft decision values.

Figure 2:
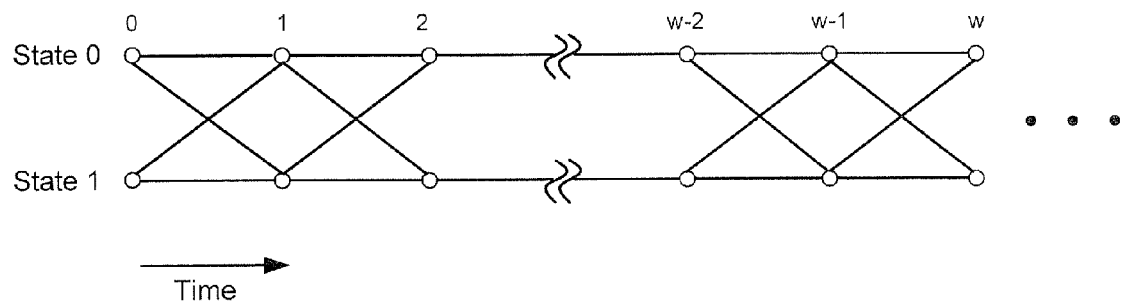
FIG. 2 illustrates a conventional trellis diagram for the channel 1-D of FIG. 1.

To supply the same processing rate as the parallel MAP detector shown in FIG. 2, which is four times the processing rate of each MAP detector, the fifth MAP detector is needed to compensate for the reduced processing rate of each of the detectors 502a-d associated with the learning mode processes. It should be appreciated that this architecture uses a fewer number of Viterbi operators overall compared with that shown in FIG. 4. As with the parallel detector 200 in FIG. 4, the parallel detector 500 of FIG. 8 greatly reduces buffer space needed for sampled data.

In the drawings and specification, there have been disclosed typical preferred embodiments of the invention and, although specific terms are employed, they are used in a generic and descriptive sense only and not for purposes of limitation, the scope of the invention being set forth in the following claims.

What is claimed is:

1. A soft decision value output detector comprising:
a plurality of maximum a posteriori (MAP) detectors configured to simultaneously generate state metrics for portions of a sampled data sequence, and to generate soft decision values based on the generated state metrics, wherein each of the MAP detectors comprises a first reverse Viterbi operator, a second reverse Viterbi operator, and a forward Viterbi operator, and wherein the plurality of MAP detectors comprise a number of MAP detectors that is at least one plus the ratio of a rate at which the sampled data sequence is input to the plurality of MAP detectors and a rate at which each MAP detector processes the sampled data sequence.

2. The soft decision value output detector of claim 1, wherein the plurality of MAP detectors are configured to simultaneously generate the state metrics for partially overlapped multiple convergence length portions of the sampled data sequence.

3. The soft decision value output detector of claim 1, wherein each of the plurality of MAP detectors is configured to generate soft decision values for a portion of the sampled data sequence that is adjacent to a portion of the sampled data sequence for which another one of the MAP detectors generates soft decision values.

4. The soft decision value output detector of claim 1, wherein, within each of the plurality of MAP detectors, a first MAP unit is configured to generate soft decision values for a first portion of the sampled data sequence that is immediately adjacent to a second portion of the sampled data sequence for which a second MAP unit generates soft decision values.

5. The soft decision value output detector of claim 4, wherein, within each of the plurality of MAP detectors, the first MAP unit is configured to generate the soft decision values about a defined number of P convergence lengths sample time before the second MAP unit generates the soft decision values.

6. The soft decision value output detector of claim 1, wherein:
the plurality of MAP detectors are configured to generate soft decision values for sequential portions of the sampled data sequence.

7. The soft decision value output detector of claim 6, wherein:
the plurality of MAP detectors are configured to generate soft decision values about one convergence length sample time after another one of the plurality of MAP detectors generates soft decision values.

8. The soft decision value output detector of claim 6, wherein the soft decision values generated by the plurality of MAP detectors have less than a convergence length sample time therebetween.

9. The soft decision value output detector of claim 1, wherein
the plurality of MAP detectors comprises four MAP detectors;
a first MAP detector is configured to generate soft decision values for a first portion of the sampled data sequence;
a second MAP detector is configured to generate soft decision values for a second portion of the sampled data sequence that is immediately adjacent to the first portion;
a third MAP detector is configured to generate soft decision values for a third portion of the sampled data sequence that is immediately adjacent to the second portion; and
a fourth MAP detector is configured to generate soft decision values for a fourth portion of the sampled data sequence that is immediately adjacent to the third portion.

10. The soft decision value output detector of claim 1, wherein the plurality of MAP detectors are configured to generate soft decision values for portions of the sampled data sequence at least at a rate at which the portions of the sampled data sequence are input to the plurality of MAP detectors.

11. The soft decision value output detector of claim 1, wherein the sampled data sequence is based on a read signal of data recorded on a disk in a disk drive.

12. A soft decision value output detector comprising:
a plurality of maximum a posteriori (MAP) detectors configured to simultaneously generate state metrics for portions of a sampled data sequence, and to generate soft decision values based on the generated state metrics,
wherein each of the MAP detectors comprises:
a first MAP unit that comprises a first forward Viterbi operator and a first reverse Viterbi operator that converge and output state metrics by respective forward iteration and reverse iteration through partially overlapped portions of the sampled data sequence; and
a second MAP unit that comprises a second forward Viterbi operator and a second reverse Viterbi operator that converge and output state metrics by respective forward iteration and reverse iteration through partially overlapped portions of the sampled data sequence, and the first and second MAP units generate the state metrics for partially overlapped portions of the sampled data sequence at a same time by alternating the first MAP unit and the second MAP unit between a learning phase starting from equiprobable states and a converged phase where reliable state metrics are produced.

13. The soft decision value output detector of claim 12, wherein each of the MAP detectors further comprises a metric reversal stack that is configured to reverse order of the state metrics from the first and second reverse Viterbi operators.

14. A soft decision value output detector comprising:
a plurality of maximum a posteriori (MAP) detectors configured to simultaneously generate state metrics for portions of a sampled data sequence, and to generate soft decision values based on the generated state metrics, wherein each of the MAP detectors comprises:
a first MAP unit that comprises a first forward Viterbi operator and a first reverse Viterbi operator that converge and output state metrics by respective forward iteration and reverse iteration through partially overlapped portions of the sampled data sequence; and
a second MAP unit that comprises a second forward Viterbi operator and a second reverse Viterbi operator that converge and output state metrics by respective forward iteration and reverse iteration through partially overlapped portions of the sampled data sequence, and wherein the plurality of MAP detectors comprise a number of MAP detectors that is at least one plus the ratio of a rate at which the sampled data sequence is input to the plurality of MAP detectors and a rate at which each MAP detector processes the sampled data sequence.

15. The soft decision value output detector of claim 14, wherein each of the plurality of MAP detectors is configured to combine the state metrics that are output from the forward and reverse Viterbi operators in the first or second MAP unit to generate soft decision values.

16. A disk drive comprising:
a disk that is configured to store data;
a transducer that is configured to read data from the disk to generate a read signal;
an analog-to-digital converter that is configured to generate a sampled data sequence from the read signal; and
a plurality of maximum a posteriori (MAP) detectors that are configured to simultaneously generate state metrics for portions of the sampled data sequence, and to generate soft decision values based on the generated state metrics, wherein each of the MAP detectors comprises a first reverse Viterbi operator, a second reverse Viterbi operator, and a forward Viterbi operator, wherein the plurality of MAP detectors comprise a number of MAP detectors that is at least one plus the ratio of a rate at which the sampled data sequence is input to the plurality of MAP detectors and a rate at which each MAP detector processes the sampled data sequence.

17. The disk drive of claim 16, wherein the plurality of MAP detectors are configured to simultaneously generate the state metrics for a plurality of adjacent convergence length portions of the sampled data sequence.

18. A method of generating soft decision values based on a sampled data sequence, the method comprising:
generating state metrics for partially overlapped portions of the sampled data sequence at a same time using a plurality of maximum a posteriori (MAP) detectors, wherein each of the MAP detectors operates a first reverse Viterbi operator and a second reverse Viterbi operator at a same time to reverse iterate through portions of the sampled data sequence to generate Viterbi based state metrics and operates a forward Viterbi operator to forward iterate through portions of the sampled data sequence to generate further Viterbi based state metrics; and
generating the soft decision values based on the generated Viterbi based state metrics, wherein each of the MAP detectors comprises a first MAP unit and a second MAP unit, and wherein generating the state metrics for partially overlapped portions of the sampled data sequence at the same time comprises:
alternating the first MAP unit and the second MAP unit between a learning phase starting from equiprobable states and a converged phase where reliable state metrics are produced.

19. The method of claim 18, wherein generating the state metrics for partially overlapped portions of the sampled data sequence comprises generating the state metrics based on a plurality of partially overlapped convergence length portions of the sampled data sequence at the same time.

20. The method of claim 18, wherein the first MAP unit comprises the first reverse Viterbi operator and the first forward Viterbi operator, the second MAP unit comprises the second reverse Viterbi operator and the second forward Viterbi operator, and wherein:
operating the first MAP unit comprises operating the first reverse and the first forward Viterbi operators at the same time to reverse iterate and forward iterate through portions of the sampled data sequence to generate Viterbi based state metrics through a learning mode and a converging mode; and
operating the second MAP unit comprises operating the second reverse and the second forward Viterbi operators at the same time to reverse iterate and forward iterate through portions of the sampled data sequence to generate Viterbi based state metrics through a learning mode and a converging mode, wherein the second MAP unit is operated at the same time as the first MAP unit.

21. The method of claim 18, wherein generating the state metrics for partially overlapped portions of the sampled data sequence at the same time comprises generating the soft decision values for portions of the sampled data sequence at least at a rate at which the portions of the sampled data sequence are input to the MAP detectors.

22. A method of generating soft decision values based on a sampled data sequence, the method comprising:
operating a plurality of maximum a posteriori (MAP) detectors to simultaneously generate state metrics for portions of the sampled data sequence, and to generate the soft decision values based on the generated state metrics, wherein each of the MAP detectors comprises a first reverse Viterbi operator, a second reverse Viterbi operator, and a forward Viterbi operator, and wherein a number of the MAP detectors that are operated simultaneously to generate the state metrics for portions of the sampled data sequence is at least one plus the ratio of a rate at which the sampled data sequence is input to the plurality of MAP detectors and a rate at which each MAP detector processes the sampled data sequence.

* * * * *